US012720840B2

(12) United States Patent
Miremad et al.

(10) Patent No.: US 12,720,840 B2
(45) Date of Patent: Aug. 25, 2026

(54) SELECTIVE GATE OVERDRIVE OF TRANSISTOR

(71) Applicant: Infineon Technologies Canada Inc., Ottawa (CA)

(72) Inventors: Seyedarmin Miremad, Kingston (CA); Iman Abdali Mashhadi, Kanata (CA); Atrin Tavakoli, Ottawa (CA); Hossein Mousavian, Kanata (CA)

(73) Assignee: Infineon Technologies Canada Inc., Ottawa (CA)

( * ) Notice: Subject to any disclaimer, the term of this patent is extended or adjusted under 35 U.S.C. 154(b) by 783 days.

(21) Appl. No.: 18/177,592

(22) Filed: Mar. 2, 2023

(65) Prior Publication Data

US 2024/0297230 A1 Sep. 5, 2024

(51) Int. Cl.

| | |
|---|---|
| ***H10D 64/23*** | (2025.01) |
| ***H10D 30/01*** | (2025.01) |
| ***H10D 62/17*** | (2025.01) |
| ***H10D 62/85*** | (2025.01) |

(52) U.S. Cl.
CPC ......... *H10D 64/256* (2025.01); *H10D 30/015* (2025.01); *H10D 62/343* (2025.01); *H10D 62/8503* (2025.01)

(58) Field of Classification Search
CPC ............. H03K 17/0822; H10D 64/256; H10D 30/015; H10D 62/343; H10D 62/8503; H10D 30/475; H10D 64/257
See application file for complete search history.

(56) References Cited

U.S. PATENT DOCUMENTS

| | | | | |
|---|---|---|---|---|
| 8,432,224 | B1 | 4/2013 | Woo | |
| 9,130,028 | B2 | 9/2015 | Bunin | |
| 2014/0209922 | A1 | 7/2014 | Ota | |
| 2015/0097610 | A1 | 4/2015 | Fife | |
| 2016/0124027 | A1 | 5/2016 | Sambucco | |
| 2018/0287602 | A1 | 10/2018 | Chauhan | |
| 2020/0014337 | A1* | 1/2020 | Scott | H03F 3/193 |
| 2022/0208761 | A1* | 6/2022 | Udrea | H10D 30/475 |

OTHER PUBLICATIONS

Written Opinion of the International Searching Authority for application No. PCT/1B2024/052021 mailed on May 6, 2024.

* cited by examiner

*Primary Examiner* — Wasiul Haider
(74) *Attorney, Agent, or Firm* — WORKMAN NYDEGGER

(57) ABSTRACT

Overdriving a power field-effect transistor. In response to a detection that the power field-effect transistor has entered the saturation region, the gate node of the power field-effect transistor is overdriven with a higher voltage. The detection of whether the power field-effect transistor is within the saturation region is done with a sense field-effect transistor. This sense field-effect transistor uses the same epitaxial stack of semiconductor layers as the power field-effect transistor. That is, the power field-effect transistor includes a part of an epitaxial stack of semiconductor layers having a heterojunction between at least two adjacent semiconductor layers, and the sense field-effect transistor includes another part of this same epitaxial stack of semiconductor layers.

19 Claims, 15 Drawing Sheets

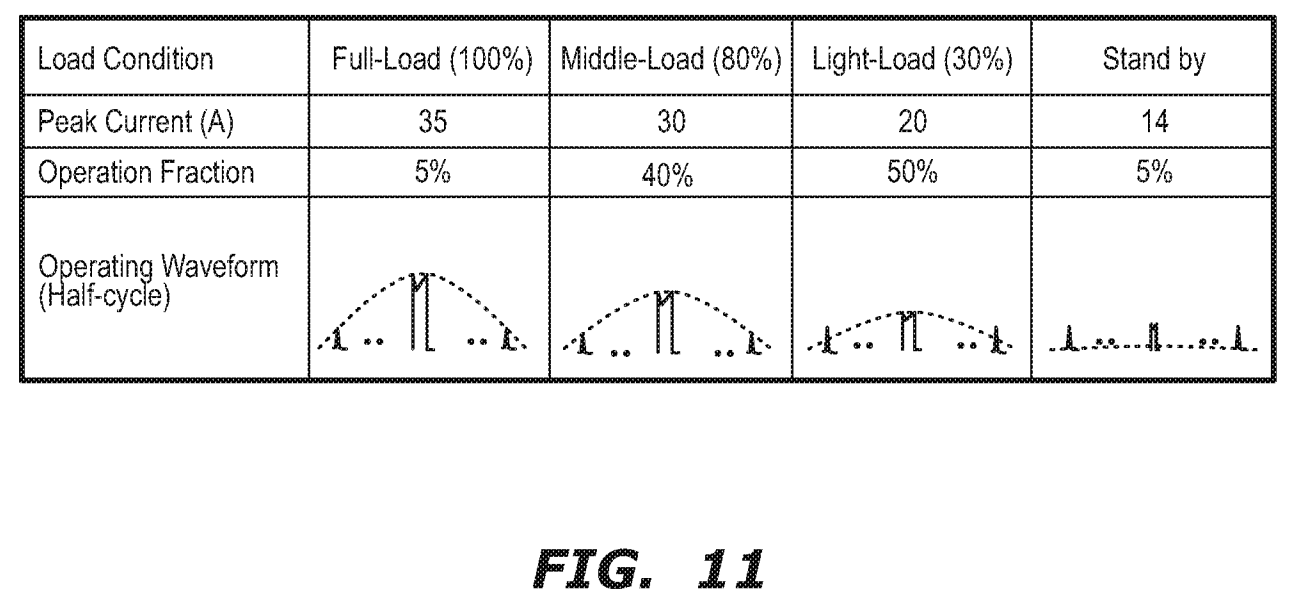

| Load Condition | Full-Load (100%) | Middle-Load (80%) | Light-Load (30%) | Stand by |
|---|---|---|---|---|
| Peak Current (A) | 35 | 30 | 20 | 14 |
| Operation Fraction | 5% | 40% | 50% | 5% |
| Operating Waveform (Half-cycle) | | | | |

FIG. 11

SELECTIVE GATE OVERDRIVE OF TRANSISTOR

BACKGROUND OF THE INVENTION

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, negligible or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current—hence the term "field-effect transistor".

Normal transistors are used for amplifying and switching purposes. On the other hand, power transistors are used to convey more substantial current and have higher voltage ratings, and may more typically be used in power supplies, battery charging, and the like. Power transistors can typically operate with currents greater than 1 Amp to as much as a hundred amps or even greater. Power transistors may convey power greater than 1 Watt to as many as hundreds of watts or even greater.

Semiconductor power transistors typically operate in the linear region, in which the current conveyed between the drain and source terminals is approximately proportional to the voltage between the drain and source terminals. In other words, in the linear region, the semiconductor power transistors have a relatively constant resistance. This constant resistance is referred to as "on resistance", and is a characteristic property of a field-effect transistor. However, if the transistor enters a saturation region of operation, the drain-to-source voltage $V_{DS}$ can increase dramatically with increases in the drain current $i_D$. In other words, on resistance increases in the saturation region of operation. This means that the power consumed by the field-effect transistor (which is $V_{DS} \times i_D$) can surge with increases in the drain current $i_D$ when in the saturation region. This can generate excessive heat in the transistor.

The subject matter claimed herein is not limited to embodiments that solve any disadvantages or that operate only in environments such as those described above. Rather, this background is only provided to illustrate one example technology area where some embodiments described herein may be practiced.

SUMMARY OF THE INVENTION

At least some embodiments described herein relate to a circuit for overdriving a power field-effect transistor. Semiconductor power field-effect transistors typically operate in the linear region, in which the current conveyed between the drain and source nodes is approximately proportional to the voltage between the drain and source nodes. In other words, in the linear region, the semiconductor power transistor has a relatively constant resistance. This constant resistance is referred to as "on resistance", and is a characteristic property of a field-effect transistor. However, if the transistor enters a saturation region of operation, the drain-to-source voltage $V_{DS}$ can increase dramatically with increases in the drain current $I_{DS}$. In other words, on resistance increases in the saturation region of operation. This means that the power consumed by the field-effect transistor (which is $V_{DS} \times I_{DS}$) can surge with increases in the drain current $I_{DS}$ when in the saturation region. This can generate excessive heat in the transistor.

In accordance with the principles described herein, in response to a detection that the power field-effect transistor has entered the saturation region, the gate node of the power field-effect transistor is overdriven with a higher voltage. For any given gate voltage applied to the gate node of a field-effect transistor, the transistor will have a different current-voltage curve. The higher the gate voltage applied, the more current the transistor can conduct in the linear region prior to entering the saturation region. Thus, overdriving the gate voltage has the effect of forcing the power field-effect transistor from the saturation region back into the linear region. While such overdriving involves increasing the gate voltage to more than the voltage at which the transistor can operate for extended periods of time, overdriving can be done for shorter periods of time with minimal risk of harm to the transistor.

Also, in accordance with the principles described herein, the detection of whether the power field-effect transistor is within the saturation region is done with a sense field-effect transistor. This sense field-effect transistor uses the same epitaxial stack of semiconductor layers as the power field-effect transistor. That is, the power field-effect transistor includes a part of an epitaxial stack of semiconductor layers having a heterojunction between at least two adjacent semiconductor layers, and the sense field-effect transistor includes another part of this same epitaxial stack of semiconductor layers. Thus, the sense field-effect transistor can be manufactured at the same time as the power field-effect transistor using the same semiconductor processing steps. Furthermore, the sense field-effect transistor has the same capability to handle high drain voltages, and can thus share a drain node with the power field-effect transistor. Furthermore, the sense field-effect transistor more closely mirrors (at smaller current scales) the operational state of the power field-effect transistor. Thus, the use of the sense current field-effect transistor that uses the same epitaxial stack as the power field-effect transistor allows for accurate detection of saturation at high voltages without significant introduction of semiconductor processing complexity.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the advantages and features of the systems and methods described herein can be obtained, a more particular description of the embodiments briefly described above will be rendered by reference to specific embodiments thereof which are illustrated in the appended drawings. Understanding that these drawings depict only typical embodiments of the systems and methods described herein, and are not therefore to be considered to be limiting of their scope, certain systems and methods will be described and explained with additional specificity and detail through the use of the accompanying drawings in which:

FIG. 11 shows a table listing example data comprising load condition, peak current, operation fraction and operating waveforms (half-cycle) for operation of a totem pole bridgeless PFC (power factor converter) for a range of load conditions;

DETAILED DESCRIPTION OF THE INVENTION

At least some embodiments described herein relate to a circuit for overdriving a power field-effect transistor. Semiconductor power field-effect transistors typically operate in the linear region, in which the current conveyed between the drain and source nodes (referred to as $I_{DS}$) is approximately proportional to the voltage between the drain and source nodes (referred to as $V_{DS}$). In other words, in the linear region, the semiconductor power transistor has a relatively constant resistance. This constant resistance is referred to as "on resistance", and is a characteristic property of a field-effect transistor. However, if the transistor enters a saturation region of operation, the drain-to-source voltage $V_{DS}$ can increase dramatically with increases in the drain current $I_{DS}$. In other words, the on resistance increases in the saturation region of operation. This means that the power consumed by the field-effect transistor (which is $V_{DS} \times I_{DS}$) can surge with increases in the drain current $I_{DS}$ when in the saturation region. This can generate excessive heat in the transistor, and thereby cause harm to the transistor.

Figure 1:
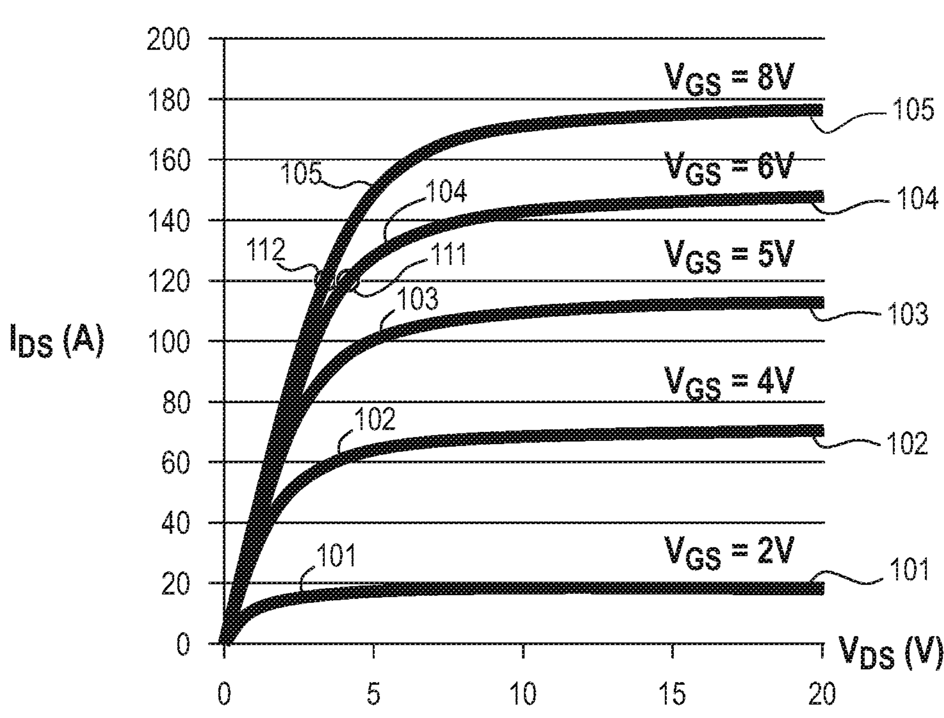
FIG. 1 illustrates a plot of different current-voltage curves for different applied gate-source voltages $V_{GS}$ for a given-power field-effect transistor.

In accordance with the principles described herein, in response to a detection that the power field-effect transistor has entered the saturation region, the gate node of the power field-effect transistor is overdriven with a higher voltage. For any given gate-source voltage applied to the gate node of a field-effect transistor, the transistor will have a different current-voltage curve. For example, FIG. 1 illustrates a plot 100 of different current-voltage curves 101 through 105 for different applied gate-source voltages $V_{GS}$ for a given-power field-effect transistor. Current (in amps) between the drain and source is represented as $I_{DS}$ on the vertical axis. Voltage (in volts) between the drain and source is represented as $V_{DS}$ on the horizontal axis. For any given curve 101 through 105, as the voltage $V_{DS}$ increases from zero, the current $I_{DS}$ increases initially linearly, but then the curve flattens and converges towards a maximum saturation current.

Comparing from curve 101 through curve 105, as the gate-source voltage $V_{GS}$ increases, the maximum saturation current also increases. For example, for this particular power field-effect transistor having the characteristic curves of FIG. 1, when the gate-source voltage $V_{GS}$ is 6 volts, the saturation current is between 140 and 150 amps. However, by increasing the gate-source voltage $V_{GS}$ to 8 volts, the saturation current is significantly higher at around 180 amps.

Note that a particular current $I_{DS}$ may correspond to the saturation region for a lower gate-source voltage $V_{GS}$, but correspond to a linear region of operation for a higher gate-source voltage $V_{GS}$. For instance, in FIG. 1, at a current of 120 amps, the transistor is on the threshold of operation in saturation when the gate-source voltage $V_{GS}$ is 6 volts (see point 111), but is clearly in the linear region when operating at the same current of 120 amps but with a gate-source voltage $V_{GS}$ of 8 volts (see point 112). FIG. 1 is just an example for a particular field-effect transistor. The current-voltage curves will be different for each field-effect transistor. Nevertheless, the general principle is the same that a field-effect transistor operating at a given current can be moved from the saturation region to the linear region by increasing the gate-source voltage $V_{GS}$.

Thus, the higher the gate voltage applied, the more current the transistor can conduct in the linear region prior to entering the saturation region. Accordingly, overdriving the gate voltage has the effect of forcing the power field-effect transistor from the saturation region back into the linear region. While such overdriving may increase the gate voltage to more than the voltage at which the transistor can operate for extended periods of time, overdriving can be done for shorter periods of time with minimal risk of harm to the transistor.

Also, in accordance with the principles described herein, the detection of whether the power field-effect transistor is within the saturation region is done with a sense field-effect transistor. This sense field-effect transistor uses the same epitaxial stack of semiconductor layers as the power field-effect transistor. This has the effect of improving accuracy of the detection of saturation, and also allows the sense transistor to be operational at high voltages with little increase in manufacturing complexity.

Figure 2:
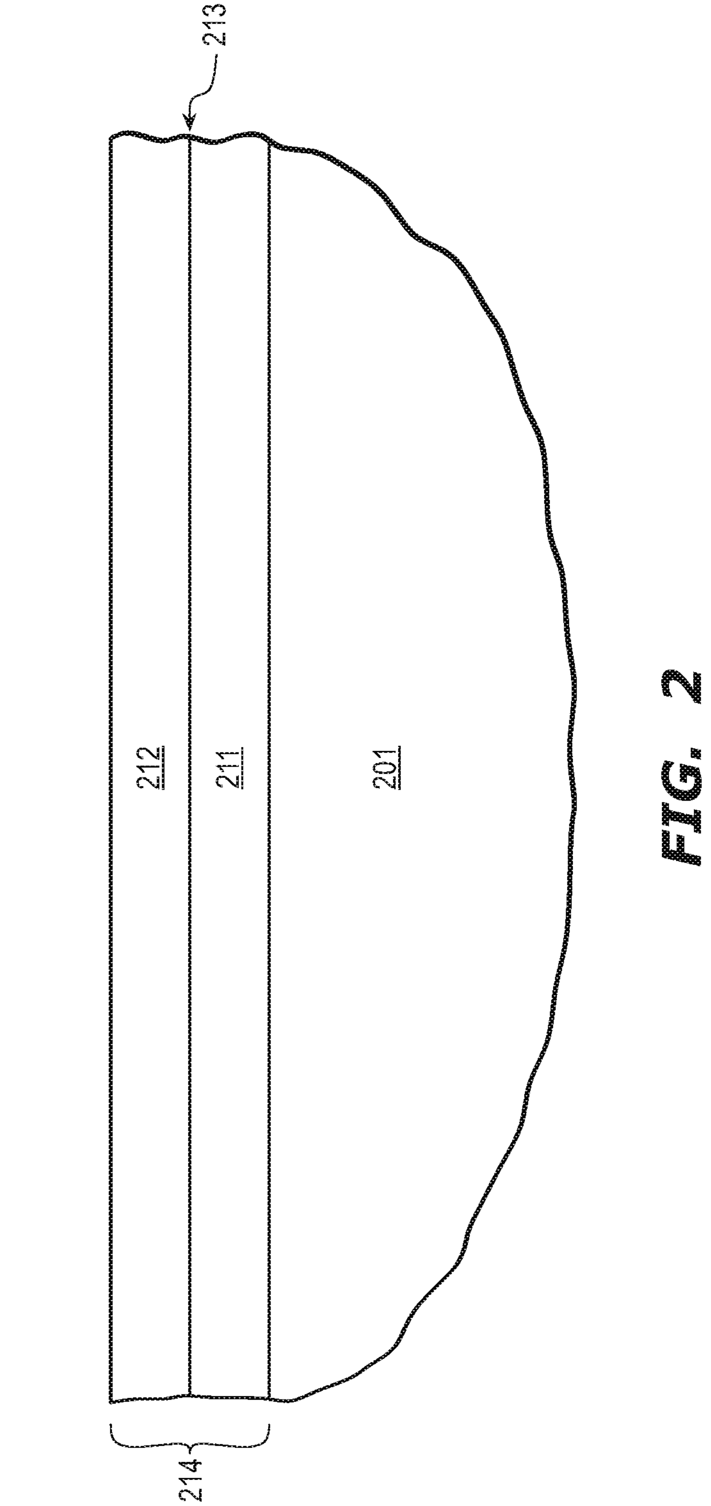
FIG. 2 illustrates a cross-sectional view of a semiconductor structure that has an epitaxial stack that is epitaxially grown on a substrate.

For example, FIG. 2 illustrates a cross-sectional view of a semiconductor structure 200 that has an epitaxial stack 214 that is epitaxially grown on a substrate 201. As an example only, the substrate 201 may be a silicon substrate, or perhaps sapphire or quartz. However, the substrate 201 may be any material upon which the epitaxial stack 214 may be epitaxially grown. The substrate 201 may even be of the same material as the lowest layer 211 of the epitaxial stack 214.

The epitaxial stack includes a lower layer 211 and an upper layer 212 that are composed of semiconductor materials having different bandgaps. Since the bandgap of the lower layer 211 is different than the bandgap of the upper layer 212, there is a heterojunction 213 between the lower layer 211 and the upper layer 212. A built-in potential difference at the heterojunction 213 is induced due to the difference between the bandgap of the material making up the lower layer 211 and the bandgap of the material making up the upper layer 212. The presence of a heterojunction 213 allows for control of charge carriers. Accordingly, transistors may be fabricated that use part of the epitaxial stack 214.

There may be other layers within the epitaxial stack 214 that are not shown in FIG. 2. For example, there may be layers between the lower layer 211 and the substrate 201 that operate as lattice relaxation layers that reduce mechanical stress due to differences between the lattice constants of the lower layer 211 and the substrate 201. However, the principles described herein are not limited to what other layers there may be. Accordingly, only the two layers 211 and 212 that define the heterojunction 213 are illustrated in the stack 214 in FIG. 2. Also, although the lower layer 211 and the upper layer 212 are shown as having approximately equal thicknesses, that is not required. The stack may include layers of any thickness as appropriate given the materials and design.

As previously mentioned, transistors may be fabricated that each use part of the epitaxial stack 214. The principles described herein are not limited to the type of the transistor, but can include any type of transistor that uses an epitaxial stack. An example of such a field-effect transistor is a high electron mobility transistor (HEMT). As further examples, the field-effect transistor may be a gallium nitride transistor in which case the layer 211 is an active layer composed of gallium nitride, a silicon carbide transistor in which case the layer 211 is an active layer composed of silicon carbide, a gallium arsenide transistor in which case the layer 211 is an active layer composed of gallium arsenide, an indium gallium arsenide transistor in which case the layer 211 is an active layer composed of indium gallium arsenide, and an indium aluminum arsenide transistor in which case the layer 211 is an active layer composed of indium aluminum arsenide. The transistor may be enhancement mode or depletion mode. However, the principles described herein are not limited to the type of field-effect transistor that uses the epitaxial stack. Nevertheless, all transistors that use the same epitaxial stack are integrated on the same chip.

Figure 3:
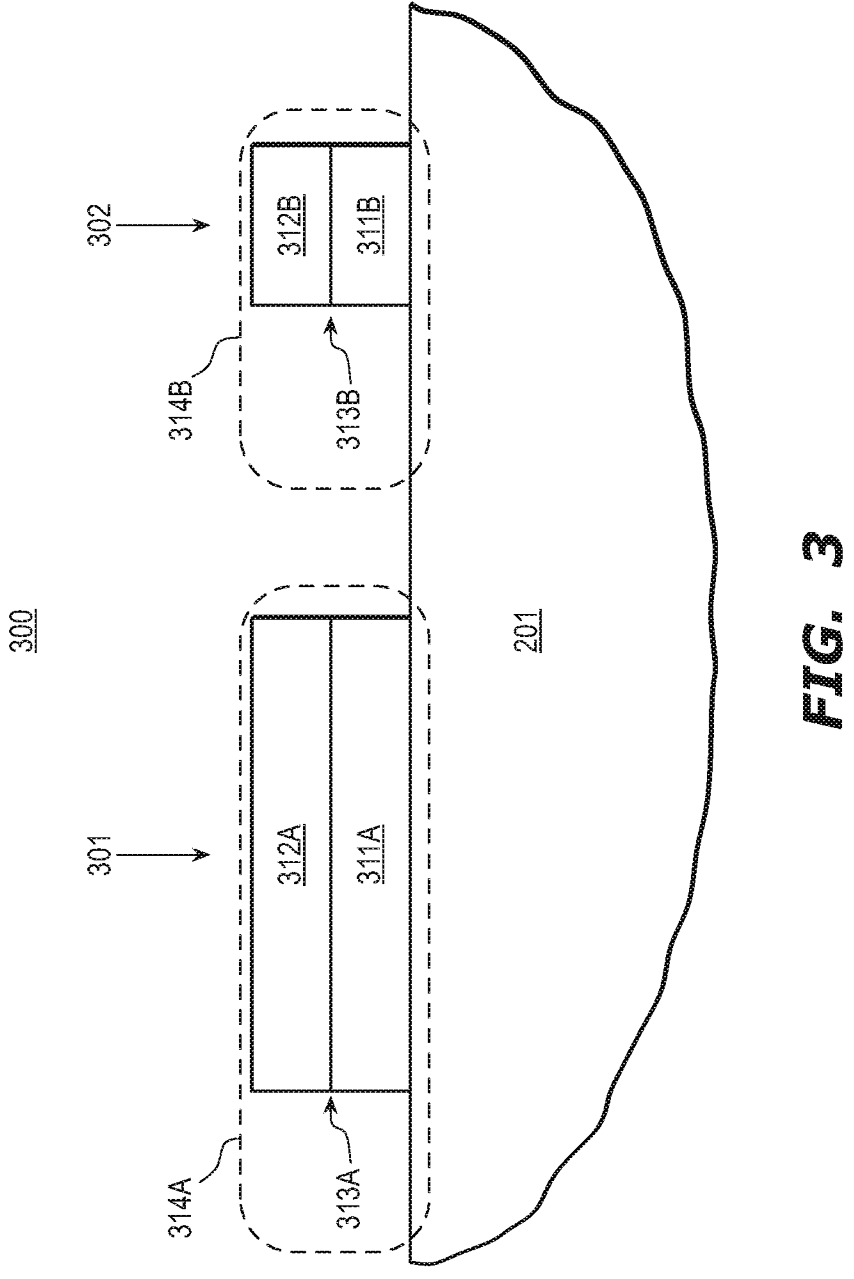
FIG. 3 illustrates a cross-sectional view of a semiconductor structure that is the same as the semiconductor structure of FIG. 2, but at a subsequent stage of processing after two transistors are formed.

FIG. 3 illustrates a cross-sectional view of a semiconductor structure 300 that is the same as the semiconductor structure 200 of FIG. 2, but at a subsequent stage of processing after two transistors 301 and 302 are formed. Each transistor 301 and 302 is formed of a corresponding part of the epitaxial stack 214. There may be other layers and components of those transistors 301 and 302 that are not illustrated in FIG. 3, because the principles described herein are not limited to what other structures there are. As examples only, there may be overlying interconnect layers that connect the transistor to the various nodes (source, gate and drain) of the transistor, the define field plates, that define passivation structures that perform proper electrical isolation and mechanical protection, and so forth.

Whatever those structures may be, FIG. 3 illustrates that the power field-effect transistor 301 includes part 314A of the original epitaxial stack 214, and the sense field-effect transistor 302 includes another part 314B of the original epitaxial stack 214. That is the part 314A of the epitaxial stack includes a part 311A of the original lower layer 211, and a part 312A of the original upper layer 212. The part 314A includes a heterojunction 313A between the lower layer part 311A and the upper layer part 312A. The heterojunction 313A is used by the transistor 301 to control electrical flow through the transistor 301. Similarly, the part 314B of the epitaxial stack includes a part 311B of the original lower layer 211, and a part 312B of the original upper layer 212. the part 314B includes a heterojunction 313B between the lower layer part 311B and the upper layer part 312B. The heterojunction 313B is used by the transistor 302 to control electrical flow through the transistor 302.

The transistor 301 is illustrated as having a larger part of the epitaxial stack than the transistor 302. Accordingly, the transistor 301 may be a power field-effect transistor, and the transistor 302 may be a sense field-effect transistor. The principles described herein are not limited to the relative size between the power field-effect transistor 301 and the sense field-effect transistor 302. However, the power field-effect transistor 301 is larger than the sense field-effect transistor 302, which is symbolized in FIG. 3 by the power field-effect transistor 301 using a part 314A of the epitaxial stack that has a larger cross-section than the part 314B of the epitaxial stack used by the sense field-effect transistor 302. Accordingly, the power field-effect transistor includes a part of an epitaxial stack of semiconductor layers having a heterojunction between at least two adjacent semiconductor layers, and the sense field-effect transistor includes another part of this same epitaxial stack of semiconductor layers.

Thus, the sense field-effect transistor can be manufactured at the same time as the power field-effect transistor using the same semiconductor processing steps. For example, the power field-effect transistor 301 may be the same type of transistor as the sense field-effect transistor 302. As an example, if the power field-effect transistor 301 is a high electron mobility transistor (HEMT), the sense field-effect transistor 302 is an HEMT sense transistor. If the power field-effect transistor 301 is a gallium nitride power transistor, the sense field-effect transistor 302 is a gallium nitride sense transistor. If the power field-effect transistor 301 is a silicon carbide power transistor, the sense field-effect transistor 302 is a silicon carbide sense transistor. If the power field-effect transistor 301 is a gallium arsenide power transistor, the sense field-effect transistor 302 is a gallium arsenide sense transistor. If the power field-effect transistor 301 is an indium gallium arsenide power transistor, the sense field-effect transistor 302 is an indium gallium arsenide sense transistor. If the power field-effect transistor 301 is an indium aluminum arsenide power transistor, the sense field-effect transistor 302 is an indium aluminum arsenide sense transistor. If the power field-effect transistor 301 is an enhancement mode power transistor, the sense field-effect transistor 302 is an enhancement mode sense transistor. If the power field-effect transistor 301 is a depletion mode power transistor, the sense field-effect transistor 302 is depletion mode sense transistor. Regardless of the type of the power field-effect transistor, the sense field-transistor is of the same type, but smaller. That is, the characteristics, such as the threshold voltages and the current voltage curves may be the same for the power field-effect transistor and the sense field-effect transistor (with the caveat that the sense field-effect transistor conducts lower currents).

The power field-effect transistor 301 may have the capability to operate at high voltages, perhaps with drain voltages of higher than 100 volts. Since the sense field-effect transistor 302 is manufactured with the same materials, the sense field-effect transistor may similarly be capable of operating with drain voltages that exceed 100 volts. Furthermore, the sense field-effect transistor more closely mirrors (at smaller current scales) the operational state of the power field-effect transistor. Thus, the use of the sense current field-effect transistor that uses the same epitaxial stack as the power field-effect transistor allows for accurate detection of saturation at high voltages without significant introduction of semiconductor processing complexity.

Figure 4:
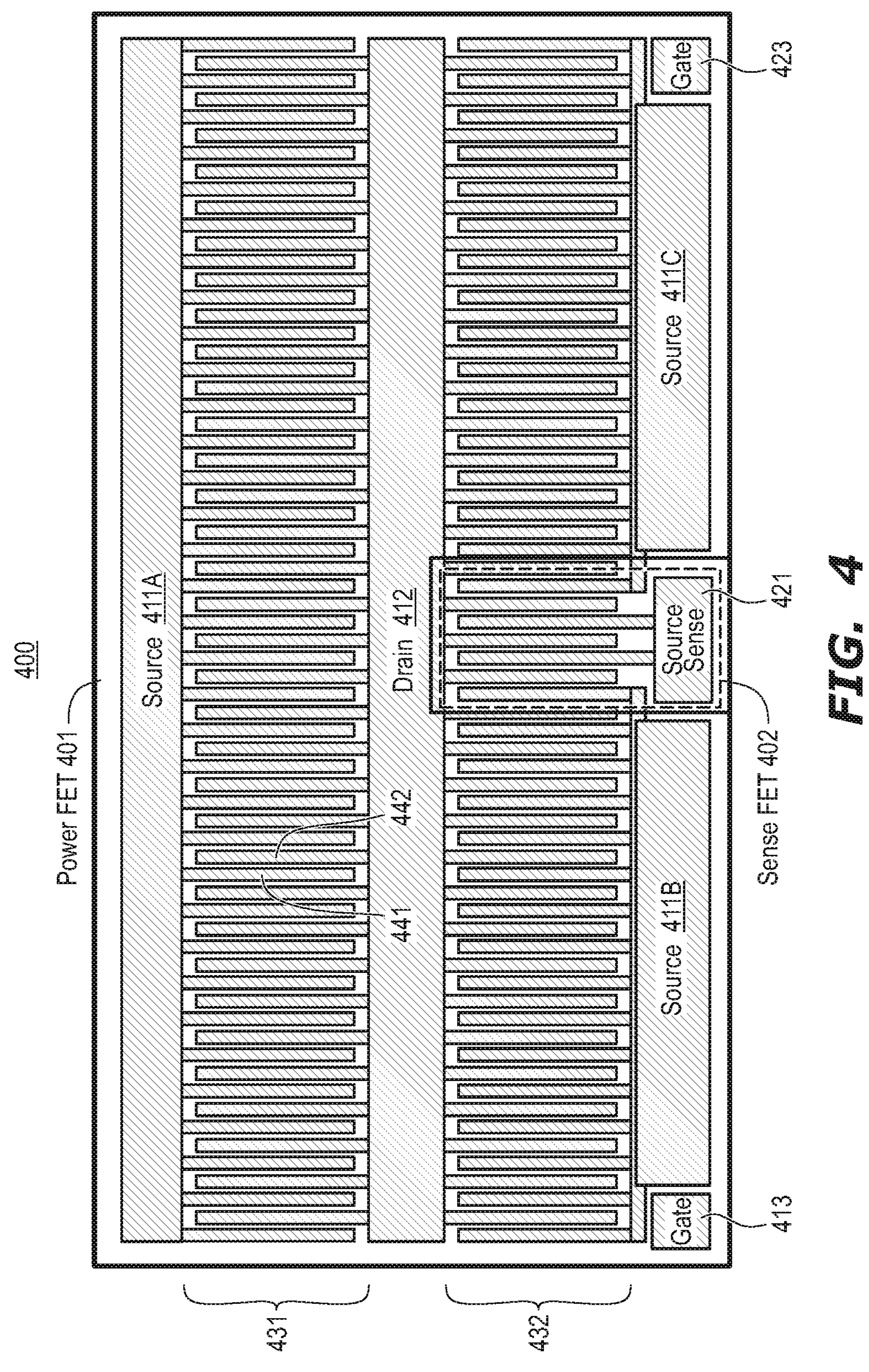
FIG. 4 illustrates a plan view of a finger array that includes a power field-effect transistor and a sense field-effect transistor.

The power field-effect transistor and the sense field-effect transistor may, for example, be fabricated in the same finger array. As an example, FIG. 4 illustrates a plan view of a finger array 400 that includes a power field-effect transistor 401 and a sense field-effect transistor 402. The power field-effect transistor 401 may for example be the same as the power field-effect transistor 301 of FIG. 3. The sense field-effect transistor 402 may for example be the same as the sense field-effect transistor of FIG. 3. Metallization is illustrated using cross-hatching. The fingers are represented within a first subarray 431 and a second subarray 432.

The first subarray 431 includes numerous (34 in the example of FIG. 4) fingers extending downward from a source node 411A of a power field-effect transistor 401 (see e.g., finger 441), and numerous (33 in the example of FIG. 4) fingers extending upwards from a drain node 412 (see e.g., finger 442). The drain node 412 is shared by the power field-effect transistor 401 and a sense field-effect transistor 402.

The second subarray 432 includes numerous (33 in the example of FIG. 3) fingers extending downward from the drain node 412. The second subarray 432 also includes numerous (34 in the example of FIG. 4) fingers extending upwards. Specifically, in this example, 16 fingers extend upwards from source node 411B, and 16 fingers extend upwards from source node 411C. Only 2 fingers extend upwards from the source 421. The source nodes 411A, 411B and 411C are all connected and collectively represent a source node of the power field-effect transistor 401. On the other hand, the source 421 is the source node of the sense field-effect transistor 402. The gate node 413 is the gate of the power field-effect transistor 401. The gate node 423 is the gate of the sense field-effect transistor 402.

With reference to FIG. 4, fingers that extend from a source node will be referred to as "source fingers", and fingers that extend from a drain node will be referred to as "drain fingers". In FIG. 4, the source fingers and drain fingers are interlaced. A cell is composed of a single source finger and a neighboring drain finger. In each cell, current will flow horizontally between the neighboring fingers of the cell. For instance, current may flow in the underlying semiconductor channel between the source finger 411 and the drain finger 412.

The effective channel width is proportional to the number of source fingers connected to the respective source. In FIG. 4, there are 66 source fingers for the power field-effect transistor 401, and 2 source fingers for the sense field-effect transistor 402. The channel width and gate widths are approximately the same, and thus, the ratio of the gate width of the power field-effect transistor 401 to the gate width of the sense field-effect transistor 402 is approximately 33 (i.e., 66/2). The principles of the finger array may be extended to generate an even larger finger array to generate even greater gate width ratios. For instance, gate width ratios of greater than 500 or even 1000 may be achieved. This may be possible by having but a single cell of a source finger and a drain finger for the sense field-effect transistor, and by having hundreds or thousands of similar cells for the power field-effect transistor.

By fabricating the power field-effect transistor and the sense field-effect transistor in the same array, the operation of the power field-effect transistor may closely mirror the operation of the sense field-effect transistor in all respects except for the scale of the current passing through the channel region. Thus, the sense field-effect transistor and the power field-effect transistor are likely to enter the saturation region and the linear region at about the same time, especially with the drain nodes being shared, as shown in FIG. 4.

Figure 5:
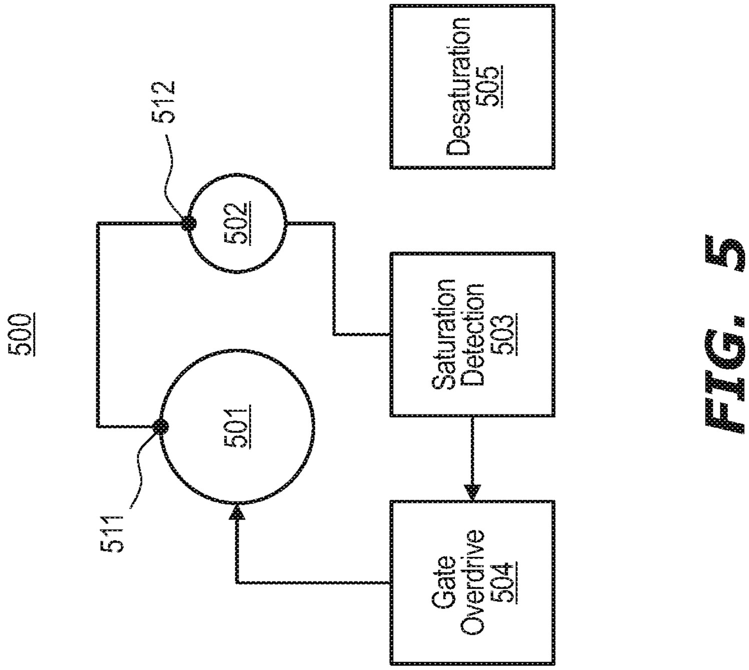
FIG. 5 illustrates an example circuit for overdriving a power field-effect transistor in accordance with the principles described herein.

FIG. 5 illustrates an example circuit 500 for overdriving a power field-effect transistor in accordance with the principles described herein. The circuit 500 includes a power field-effect transistor 501, a sense field-effect transistor 502, a saturation detection circuit 503, a gate overdrive circuit 504, and optionally a desaturation circuit 505. The power field-effect transistor 501 and the sense field-effect transistor 502 are represented as simple circles, which represents that the principles described herein are not limited to what type of field-effect transistor the power field-effect transistor 501 and the sense field-effect transistor 502 are. Nonetheless, as mentioned above, the power field-effect transistor 501 comprises a part of an epitaxial stack of semiconductor layers having a heterojunction between at least two adjacent semiconductor layers. Furthermore, the sense field-effect transistor 502 comprises another part of the epitaxial stack of semiconductor layers. Furthermore, as illustrated in FIG. 5, a drain node 511 of the power field-effect transistor 501 is connected to a drain node 512 of the sense field-effect transistor 502.

The circuit 500 also includes the saturation detection circuit 503, the gate overdrive circuit 504, and optionally a desaturation circuit 505. The saturation detection circuit 503 is connected to the sense field-effect transistor 502 and is configured to detect an indication that the sense field-effect transistor 502 has entered saturation. The gate overdrive circuit 504 is connected to the saturation detection circuit to respond when the saturation detection circuit 503 detects that the sense field-effect transistor 502 enters saturation. Specifically, the gate overdrive circuit 504 is also connected to the power field-effect transistor 501 and is configured to increase a gate voltage applied to a gate node of the power field-effect transistor 501 in response to the saturation detection circuit 503 detecting that the sense field-effect transistor 502 enters saturation. The function of the desaturation circuit 505 will be described further below with respect to FIGS. 9 and 10. More specific examples of the circuit 500 will be provided further below with respect to FIGS. 7 through 10.

Figure 6A:
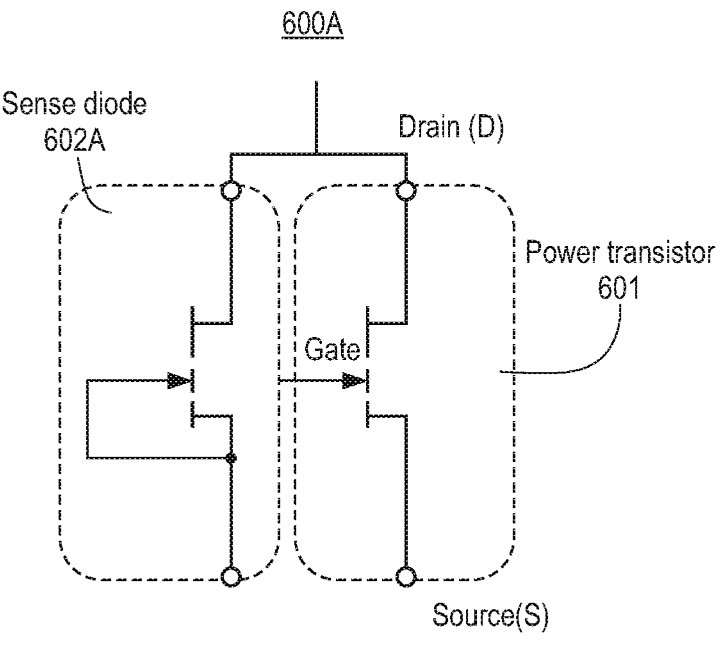
FIG. 6A illustrates an example circuit that includes a power field-effect transistor and a sense field-effect transistor, where the sense field-effect transistor is connected in a diode configuration with the gate node connected to the source node.

In some of the example circuits below, the sense field-effect transistor is configured with a gate node of the sense field-effect transistor connected to a source node of the sense field-effect transistor. For example, FIG. 6A illustrates an example circuit 600A that includes a power field-effect transistor 601 and a sense field-effect transistor 602A, where the sense field-effect transistor is connected in a diode configuration with the gate node connected to the source node. In this diode configuration, the sense field-effect transistor 602A operates as a diode in the direction from source to drain. The drain nodes of the power field-effect transistor 601 and the sense field-effect transistor 602A are shared. The power field-effect transistor 601 is an example of the power field-effect transistor 301 of FIG. 3, the power field-effect transistor 401 of FIG. 4, and the power field-effect transistor 501 of FIG. 5. The sense field-effect transistor 602A is an example of the sense field-effect transistor 302 of FIG. 3, the sense field-effect transistor 402 of FIG. 4, and the sense field-effect transistor 502 of FIG. 5. In the configuration of FIG. 6A, the sense field-effect transistor 602A acts as an embedded high voltage sense diode for measurement of drain-source voltage $V_{DS}$ of the power field-effect transistor 601.

Figure 6B:
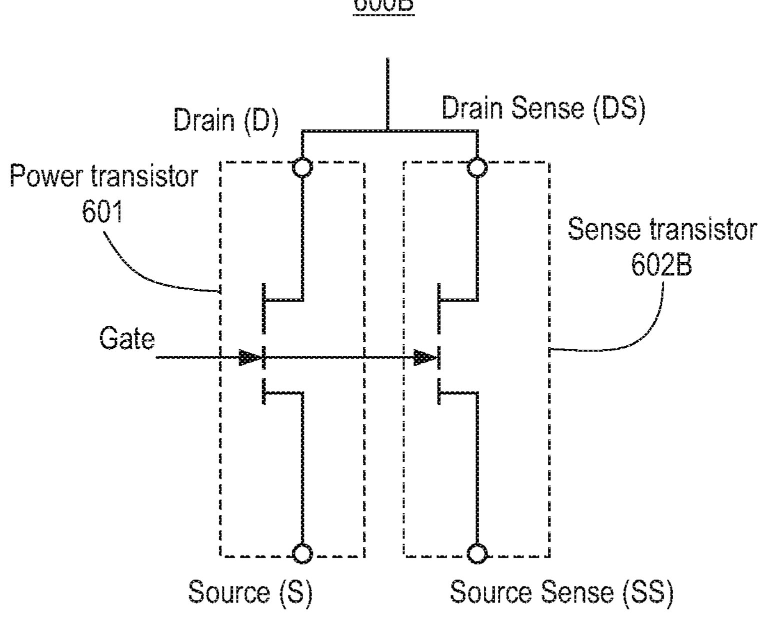
FIG. 6B illustrates an example circuit that includes the power field-effect transistor and a sense field-effect transistor, wherein the gate nodes of the field-effect transistor and the sense field-effect transistor are connected.

In other embodiments, the sense field-effect transistor is connected in shared-gate mode. For instance, FIG. 6B illustrates an example circuit 600B that includes the power field-effect transistor 601 and a sense field-effect transistor 602B, wherein the gate nodes of the field-effect transistor 601 and the sense field-effect transistor 602B are connected. Once again, the drain nodes of the power field-effect transistor 601 and the sense field-effect transistor 602B are shared. The sense field-effect transistor 602B is an example of the sense field-effect transistor 302 of FIG. 3, the sense field-effect transistor 402 of FIG. 4, and the sense field-effect transistor 502 of FIG. 5. In the configuration of FIG. 6B, the drain source voltage $V_{DS}$ of the power field-effect transistor 601 is measured through the sense field-effect transistor 602B.

Figure 7:
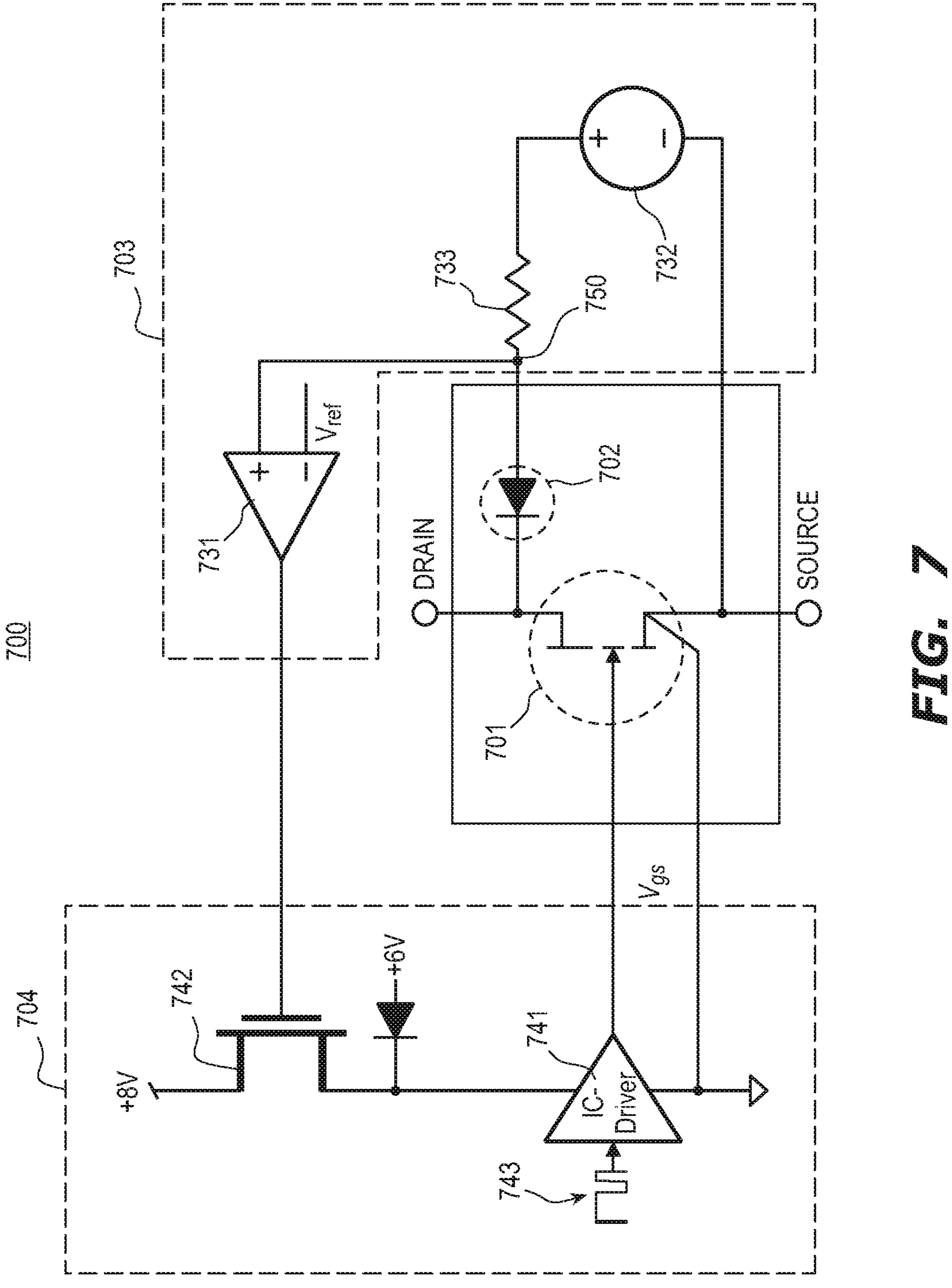
FIG. 7 illustrates a circuit that represents an example of the circuit of FIG. 5, and in which the sense transistor is connected in diode configuration.

FIG. 7 illustrates a circuit 700 that represents an example of the circuit 500 of FIG. 5. The circuit 700 includes a power field-effect transistor 701, a sense field-effect transistor 702, a saturation detection circuit 703, and a gate overdrive circuit 704, which are respectively examples of the power field-effect transistor 501, the sense field-effect transistor 502, the saturation detection circuit 503, and the gate overdrive circuit 504 of FIG. 5. In the circuit 700, the sense field-effect transistor is diode-connected as in the circuit 600A of FIG. 6A. The sense field-effect transistor 702 and the power field-effect transistor 701 are integrated in that they use different parts of the same epitaxial stack.

The gate overdrive circuit 704 includes a gate voltage generator 741 that outputs a high gate signal (to turn the power transistor 701 on) when the input signal 743 is high, and outputs a low gate signal (to turn the power transistor 701 off) when the input signal 743 is low. The gate voltage generator 741 has a high voltage supply that is at one level (e.g., 6 volts) if the transistor 742 is off, and another level (e.g., 8 volts) if the transistor 742 is on. Thus, presuming the input voltage 743 is high, a signal provided by the saturation detection circuit 703 to the gate of the transistor 742 operates to select whether the gate of the power field-effect transistor 701 is overdriven or not.

The saturation detection circuit 703 includes a comparator 731 that is configured to compare a voltage at the source node of the sense field-effect transistor 702 to a reference voltage $V_{ref}$, and output a signal representing saturation detection based on the comparison. The saturation detection circuit 703 also includes a clamp circuit that includes a dc voltage source 732 and a resistor 733 coupled in series between the source node of the power transistor 701 and the source node of the sense transistor 702. With the sense transistor arrangement shown in FIG. 7, the sense field-effect transistor 702 operates as a high voltage diode that can be integrated or embedded inside the transistor package.

When the drain-source voltage $V_{DS}$ is lower than the dc voltage source 732, the sense transistor 702 acts as a forward-biased diode, and thus the voltage at the source (see point 750) of the sense transistor 702 (and at the positive input terminal of the comparator 731) is approximately equal to $V_{DS}$ plus one threshold voltage across the diode. Depending on the level of $V_{DS}$, the comparator 731 outputs a high or low signal. However, when the drain voltage is greater than the dc voltage source 733, the sense transistor 702 acts as a reverse-biased diode, and thus the voltage at the positive input terminal of the comparator 731 is clamped at the voltage provided by the dc voltage source 733. This clamped voltage is greater than what would be indicative of saturation happening in the power transistor 701. The reference voltage $V_{ref}$ is selected to be the saturation voltage of the power transistor 701 (plus one threshold voltage across the diode 702).

Figure 8:
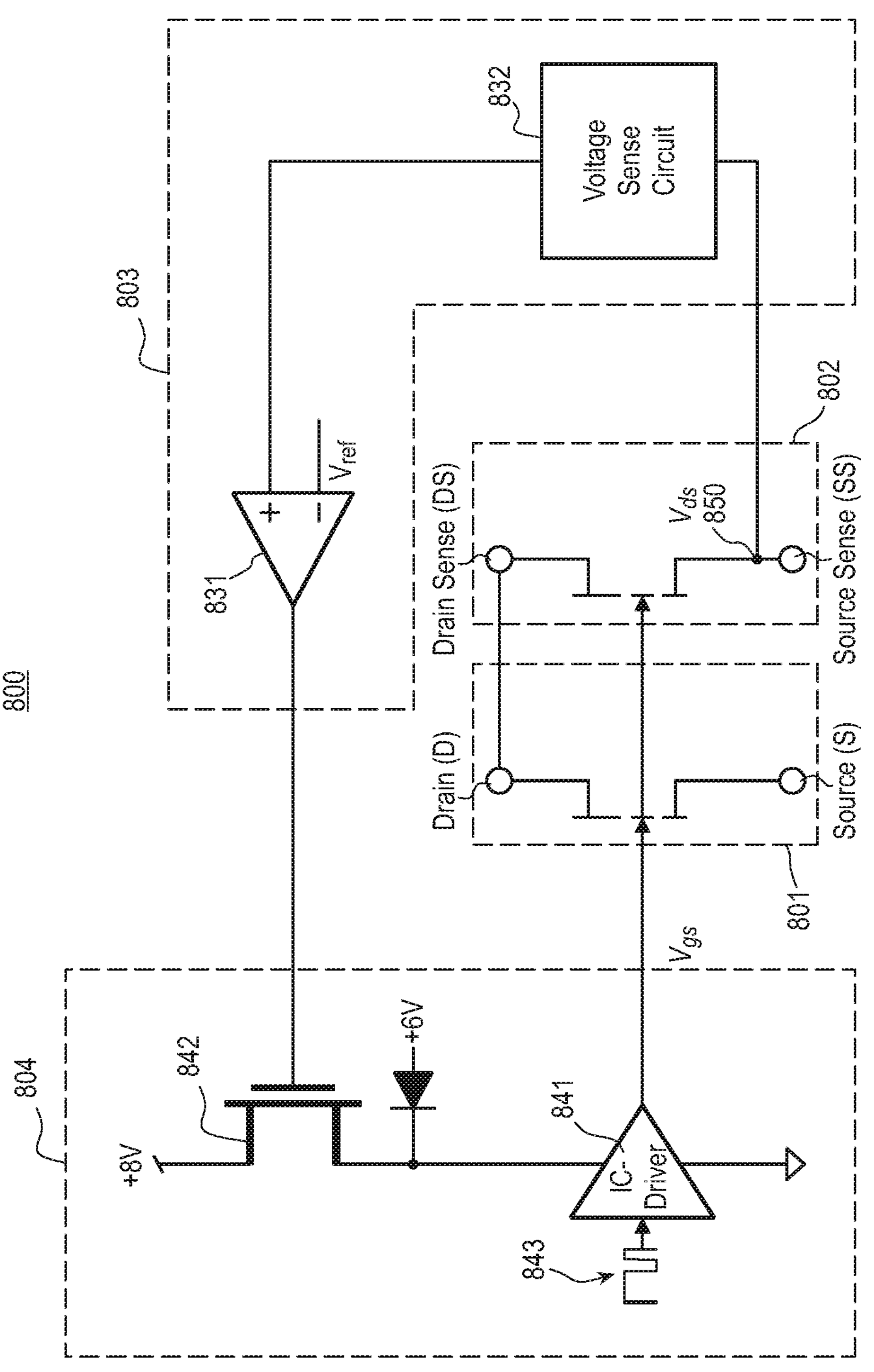
FIG. 8 illustrates a circuit that represents an example of the circuit of FIG. 5, and in which the sense transistor shares a gate with the power transistor.

FIG. 8 illustrates a circuit 800 that represents an example of the circuit 500 of FIG. 5. The circuit 800 includes a power field-effect transistor 801, a sense field-effect transistor 802, a saturation detection circuit 803, and a gate overdrive circuit 804, which are respectively examples of the power field-effect transistor 501, the sense field-effect transistor 502, the saturation detection circuit 503, and the gate overdrive circuit 504 of FIG. 5. In the circuit 800, the sense field-effect transistor 802 shares a gate with the power field-effect transistor 80' as in the circuit 600B of FIG. 6B. The sense field-effect transistor 802 and the power field-effect transistor 801 are integrated in that they use different parts of the same epitaxial stack.

The gate overdrive circuit 804 is structured as described above for the gate overdrive circuit 704 of FIG. 7. The gate voltage generator 841 outputs a high gate signal (to turn the power transistor 801 on) when the input signal 843 is high, and outputs a low gate signal (to turn the power transistor 801 off) when the input signal 843 is low. The gate voltage generator 841 has a high voltage supply that is at one level (e.g., 6 volts) if the transistor 842 is off, and another level (e.g., 8 volts) if the transistor 842 is on. Thus, a signal provided by the saturation detection circuit 803 to the gate of the transistor 842 operates to select whether or not the gate of the power field-effect transistor 801 is overdriven.

The saturation detection circuit 803 includes a voltage sense circuit 832 that detects the drain-to-source voltage $V_{DS}$ of the power transistor 801 by detecting the drain-to-source voltage $V_{DS}$ at node 850 of the sense transistor 802. The comparator 831 receives that voltage $V_{DS}$ at its positive input terminal, and a reference voltage $V_{ref}$ at its negative input terminal. The reference voltage $V_{ref}$ is selected to be the saturation voltage of the power transistor 801.

When the voltage $V_{DS}$ is lower than the reference voltage $V_{ref}$, the comparator 831 outputs a low signal, indicating that the power transistor 801 is not in saturation, and accordingly, the transistor 842 is off, meaning that the gate voltage generator outputs a normal high voltage of 6 volts (presuming the input voltage 843 is high). On the other hand, when the voltage $V_{DS}$ goes higher than the reference voltage $V_{ref}$, the comparator 831 outputs a high signal, indicating that the power transistor 801 is saturation, and accordingly, the transistor 842 is on, meaning that the gate voltage generator outputs overdrive voltage of 8 volts (presuming the input voltage 843 is high).

Figure 9:
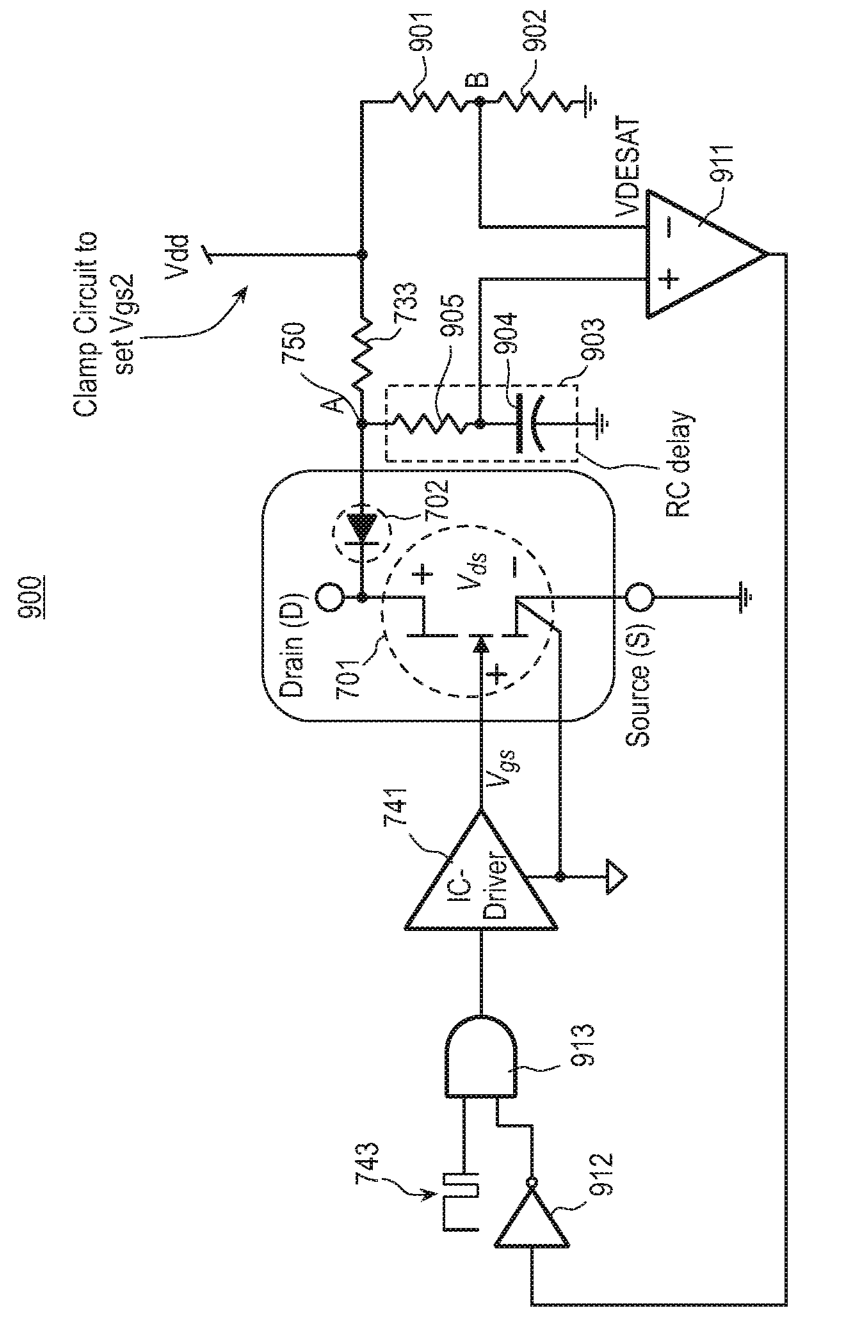
FIG. 9 illustrates a circuit that represents an augmentation of the circuit of FIG. 7, but with additional elements that operate to perform desaturation by turning the power transistor off (with some delay) if the voltage becomes higher than a desaturation voltage.

FIG. 9 illustrates a circuit 900 that represents an augmentation of the circuit 700 of FIG. 7, but with additional elements (labelled in the 900*s*) that operate to perform desaturation by turning the power transistor 701 off (with some delay) if the voltage at node 750 becomes higher than a desaturation voltage $V_{DESAT}$. Circuit elements of FIG. 7 that are not necessary in order to describe the desaturation process are omitted from FIG. 7, though they may be present within the circuit 900.

The desaturation voltage $V_{DESAT}$ is set by a divided voltage that is output by the voltage divider composed of resistors 901 and 902. The divided voltage is provided to a negative input terminal of a comparator 911. Voltage at an intermediate node of an RC delay circuit 903 (comprising a series connection of a capacitor 904 and the resistor 905) is fed to the negative input terminal of the comparator 911. The voltage at this intermediate node follows the voltage at the node 750 with some delay. The delay is introduced to allow for the overdrive process of FIG. 7 to have sufficient time to attempt to remove the power transistor from the saturation region. The delay is sufficient that if the overdrive is not successful within a reasonable time, the power transistor is just shut off through the operation of the comparator 911. The amount of delay may be set by sizing of the capacitor 904 and/or the resistor 905.

When the voltage at the intermediate node of the RC delay 903 exceeds the desaturation voltage $V_{DESAT}$, then overdriving of the gate of the power transistor was not successful to remove the power transistor from saturation within a reasonable time. In this case, the comparator 911 outputs a high signal, which translates into a low signal from the inverter 912. This low signal is provided to the AND gate 913, resulting in a low signal being provided to the gate overdrive circuit 741, forcing the gate of the power transistor 701 low, no matter what the input signal 743.

Thus, the circuit 900 includes a desaturation circuit configured to turn the power field-effect transistor off if 1) the gate overdrive circuit has already increased the gate voltage applied to the gate node in response to a prior detection that the sense field-effect transistor has entered saturation, 2) the saturation detection circuit once again detects an indication that the sense field-effect transistor has entered saturation, and 3) the gate overdrive circuit cannot increase the gate voltage applied to the gate node of the power field-effect transistor further.

Figure 10:
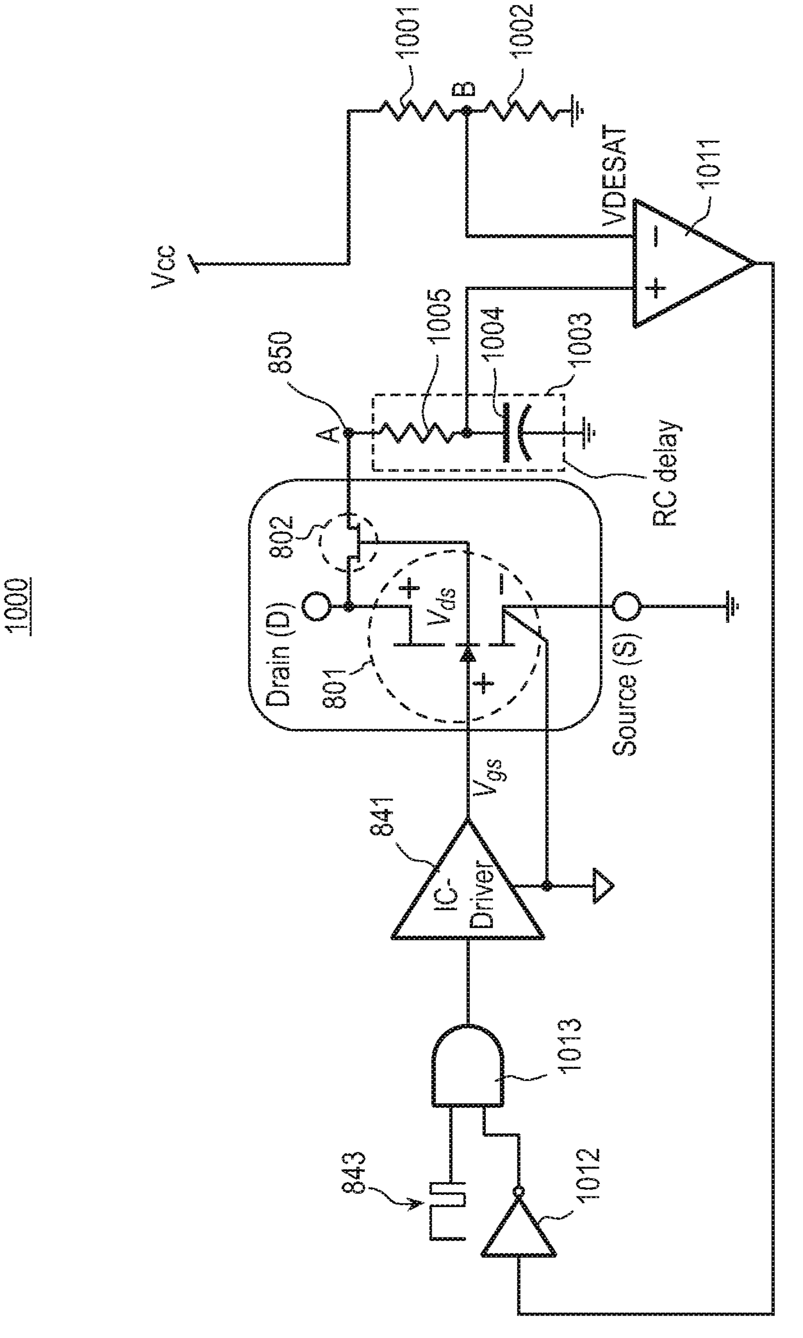
FIG. 10 illustrates a circuit that represents an augmentation of the circuit of FIG. 8, but with additional elements that operate to perform desaturation by turning the power transistor off (with some delay) if the voltage becomes higher than a desaturation voltage.

FIG. 10 illustrates a circuit 1000 that represents an augmentation of the circuit 800 of FIG. 8, but with additional elements (labelled in the 1000*s*) that operate to perform desaturation by turning the power transistor 801 off (with some delay) if the voltage at node 850 becomes higher than a desaturation voltage $V_{DESAT}$. Circuit elements of FIG. 8 that are not necessary in order to describe the desaturation process are omitted from FIG. 8, though they may be present within the circuit 1000. The circuit elements 1001, 1002, 1003, 1004, 1005, 1011, 1012, 1013 operate in similar fashion as described for circuit elements 901, 902, 903, 904, 905, 906, 911, 912, and 913 of FIG. 9. However, the circuit elements 1001, 1002, 1003, 1004, 1005, 1011, 1012, 1013 collectively operate to turn the power transistor 801 off (after some delay) regardless of the input signal 843 when the voltage at node 850 exceeds the desaturation voltage $V_{DESAT}$.

Thus, the circuit 1000 also includes a desaturation circuit configured to turn the power field-effect transistor off if 1) the gate overdrive circuit has already increased the gate voltage applied to the gate node in response to a prior detection that the sense field-effect transistor has entered saturation, 2) the saturation detection circuit once again detects an indication that the sense field-effect transistor has entered saturation, and 3) the gate overdrive circuit cannot increase the gate voltage applied to the gate node of the power field-effect transistor further.

As previously mentioned, the overdriving of the gate node of the power transistor is done at a voltage that is higher than can be safely applied for extended periods of time. However, the overdrive voltage can be applied to the gate safely for short periods of time. There are a number of applications where overdriving for only a short period would be helpful. FIG. 11 shows a table listing example data comprising load condition, peak current, operation fraction and operating waveforms (half-cycle) for operation of a totem pole bridgeless PFC (power factor converter) for a range of load conditions. For a sine-wave current output, as an example, the operating fraction at full load is 5%, the operating fraction at moderate load is 40%; the operating fraction at light load is 50%; and the operating fraction for standby is 5%. As a result, overdriving with a higher gate-source voltage $V_{GS}$ can be applied just for a short period at the peak of the current. Selective overdriving at the peak current, for a small percentage of time, will not significantly affect the reliability or reduce the device lifetime. For high current applications such as traction inverters, the inverter may operate under full-load for only a small percentage, e.g. ≤5% of the time.

Figure 12:
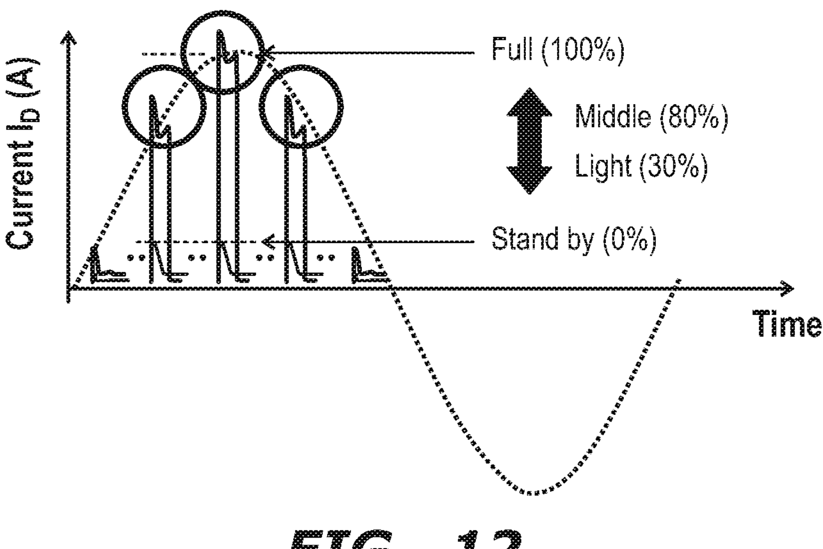
FIG. 12 shows another schematic plot of an operating waveform for drain current $I_D$ vs. time for a half cycle to illustrate the relative operating fraction during standby, light to middle load, and full load.

FIG. 12 shows another schematic plot of an operating waveform for drain current $I_D$ vs. time for a half cycle to illustrate the relative operating fraction during standby, light to middle load, and full load. By detecting the saturation point, by measuring $V_{DS}$ or $I_{DS}$, a higher gate-source voltage $V_{GS}$ can be applied so that the device operates in a linear region, out of saturation.

Figure 13:
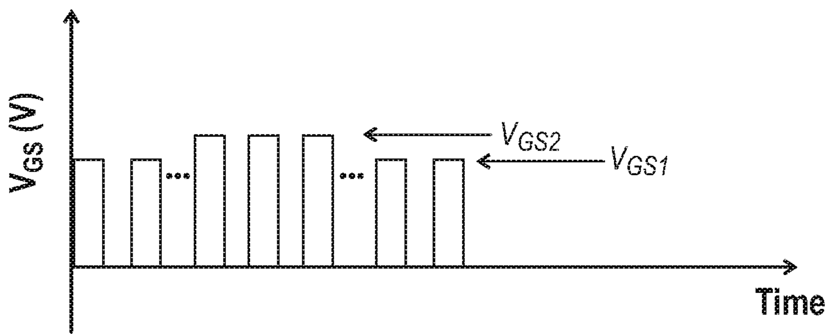
FIG. 13 shows a schematic plot of gate drive voltage $V_{GS}$ vs. time over a corresponding half-cycle for operation of a gate driver providing selective gate voltage overdrive of a first example embodiment.

FIG. 13 shows a schematic plot of gate drive voltage $V_{GS}$ vs. time over a corresponding half-cycle for operation of a gate driver providing selective gate voltage overdrive of a first example embodiment, which provides a first gate-source voltage $V_{GS1}$ during most of the cycle and $V_{gs}$ is stepped-up to a second gate-source voltage $V_{GS2}$ at the peak of the sign wave.

Figure 14:
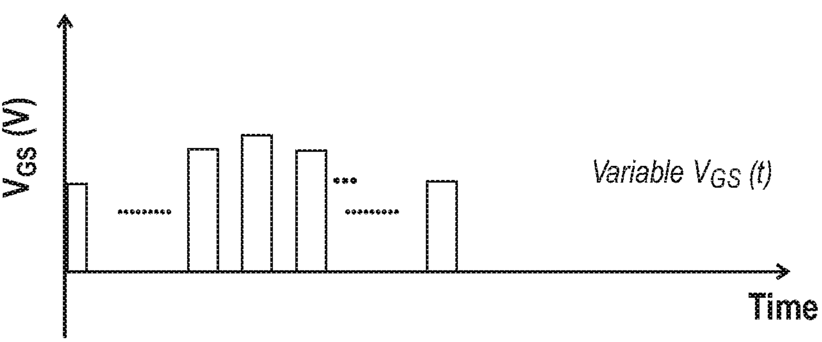
FIG. 14 shows a schematic plot of gate drive voltage vs. time over a corresponding half cycle for operation of a gate driver providing selective gate voltage overdrive of a second example embodiment.

FIG. 14 shows a schematic plot of gate drive voltage vs. time over a corresponding half cycle for operation of a gate driver providing selective gate voltage overdrive of a second example embodiment, in which $V_{GS}$ is varied over the cycle, e.g. using a variable $V_{GS}$, which is gradually increases towards the peak load, and then decreases after the peak load, e.g. in proportion to the load. Accordingly, there may be multiple possible levels of overdrive gate voltage that can be applied to the gate node of the power field-effect transistor.

Figure 15A:
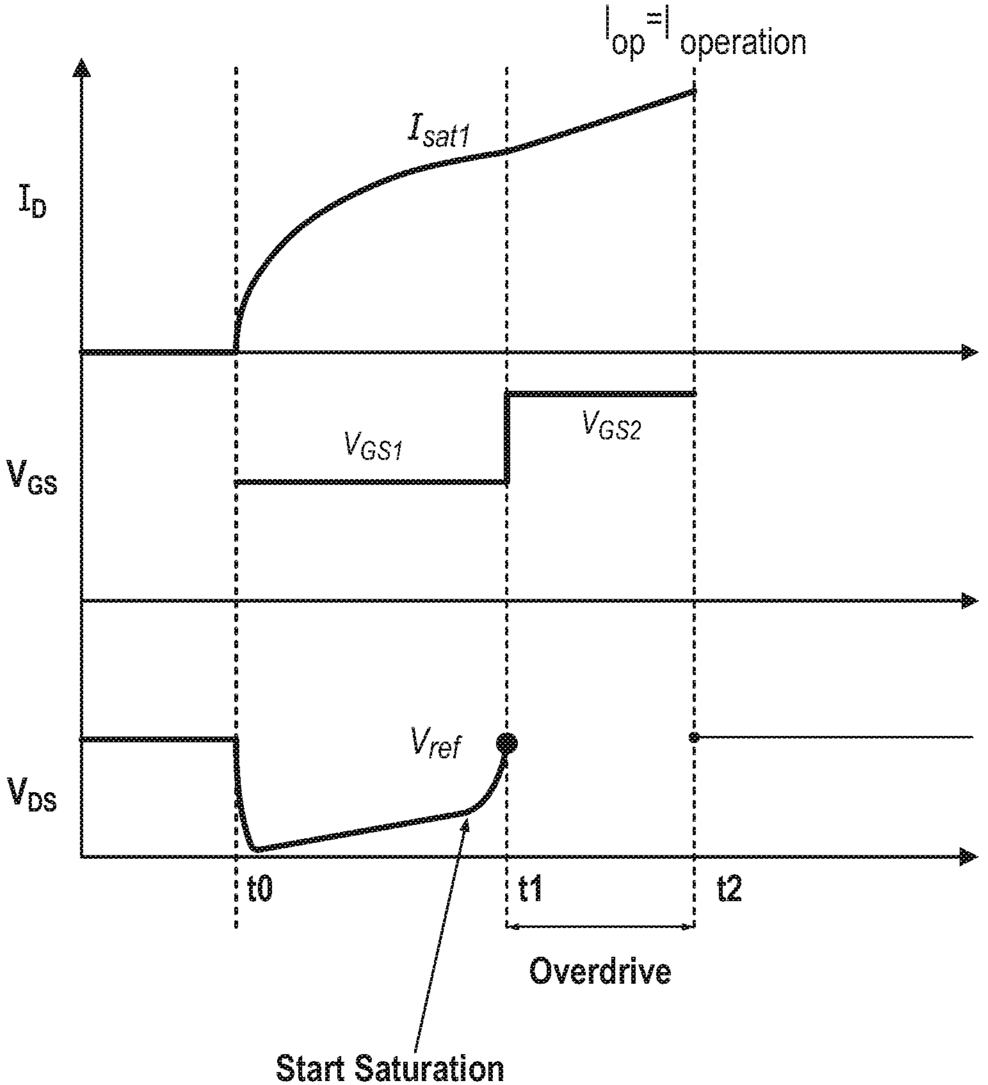
FIG. 15A illustrates first example schematic waveforms.
Figure 15B:
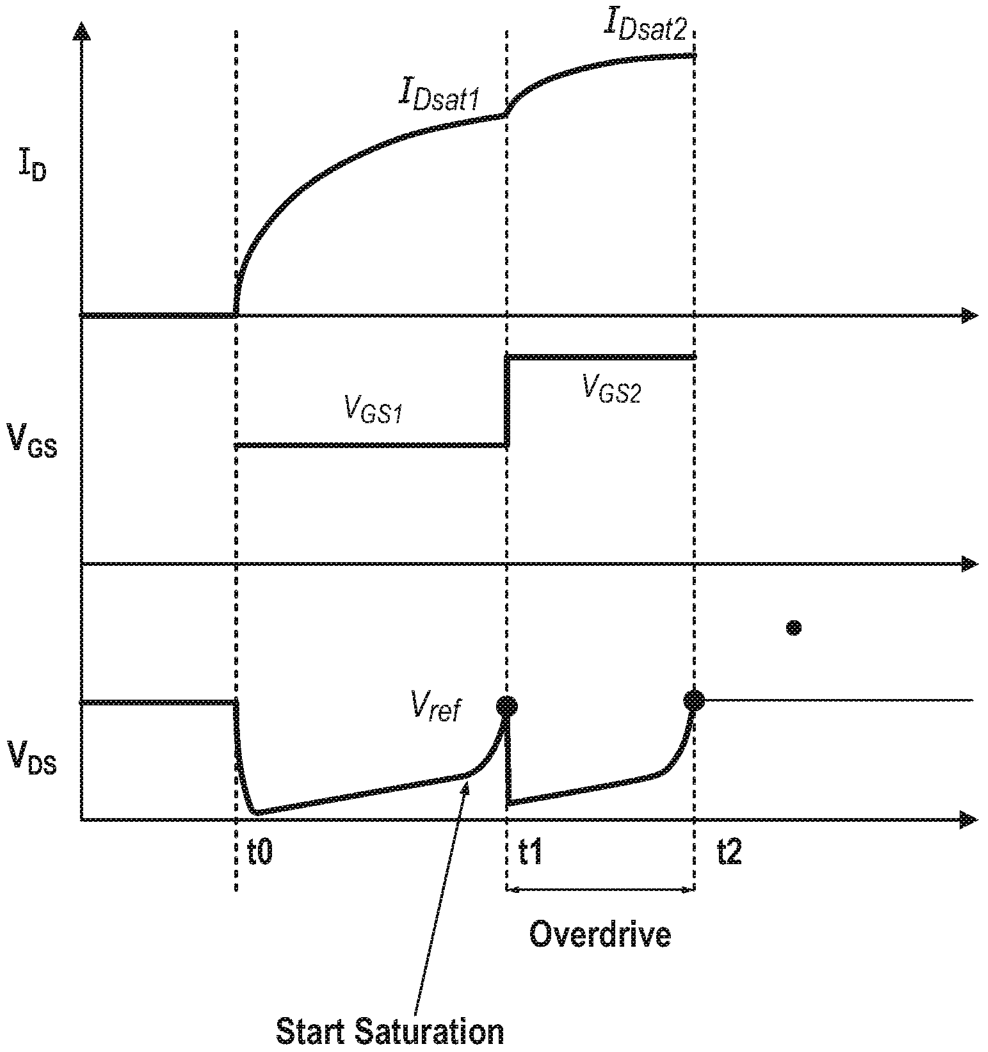
FIG. 15B illustrates second example schematic waveforms.

Schematic plots of waveforms for drain current $I_D$, drain-source voltage $V_{DS}$ and gate-source voltage $V_{GS}$ are shown in FIGS. 15A and 15B. As illustrated by the schematic waveforms in FIG. 15A, at t0 when the gate is turned-on for normal operation by a first gate-source voltage $V_{GS1}$, e.g. 6V, in the period from t0 to t1, the drain current $I_D$ rises towards a first saturation current $I_{Dsat1}$. Saturation is detected by a rise in $V_{DS}$. When $V_{DS}$ reaches a threshold value or limit value, the gate-source voltage $V_{GS}$ is increased to a higher value $V_{GS2}$, e.g. 8V, to implement over-drive, which allows the drain current $I_D$ to rise to a higher value operational current $I_{op}$, and $V_{ds}$ falls below the threshold value. Between t1 and t2, after detecting saturation, the higher gate-source voltage $V_{GS2}$, brings the device out of saturation, back into a linear region. Provided that overdriving maintains $I_{op}$ in a safe operating range, overdrive may be used.

As illustrated by the schematic waveforms in FIG. 15B, in the event that saturation is detected when driving at $V_{GS2}$, between t1 and t2, when the current reaches $I_{Dsat2}$ then a fault condition is detected, and the transistor is turned-off by reducing the gate drive voltage to below the threshold voltage $V_{gs\text{-}th}$.

Figure 16:
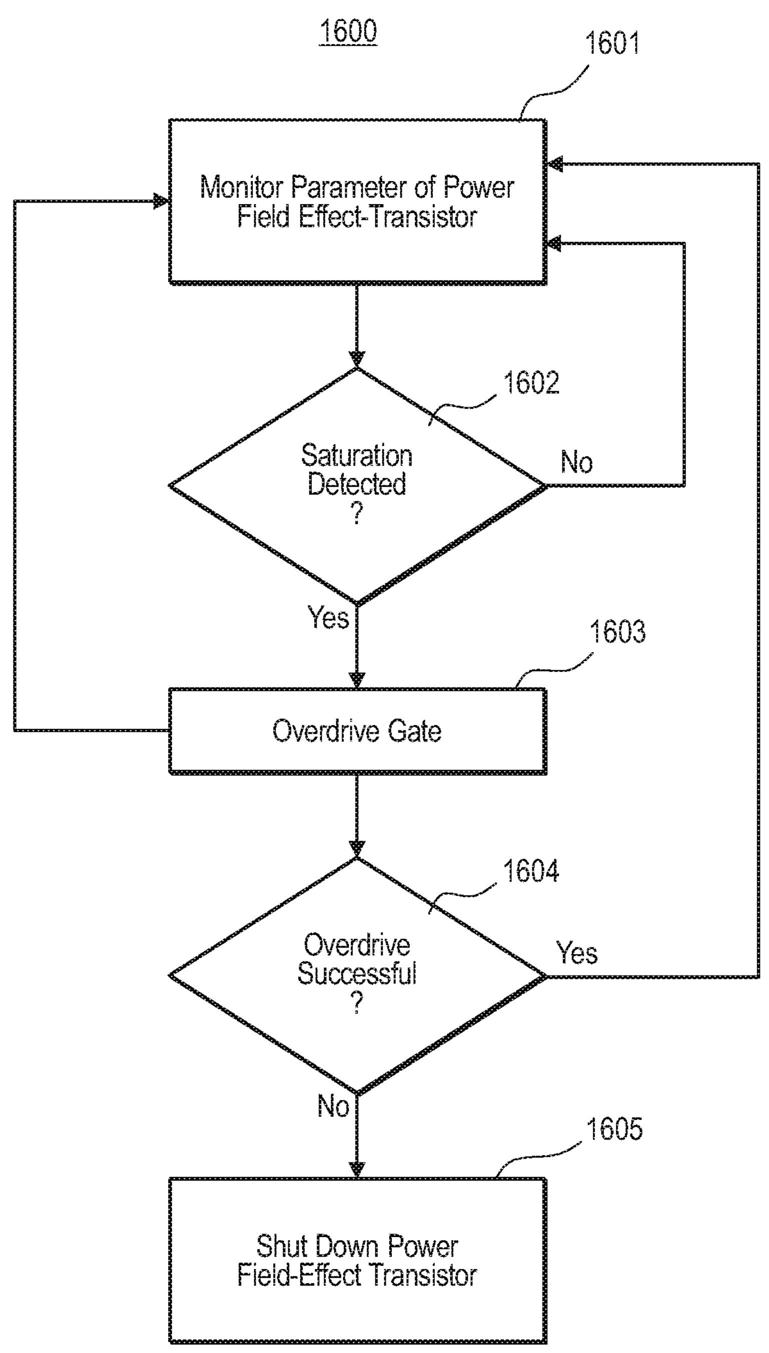
FIG. 16 illustrates a flowchart of a method for overdriving a power field-effect transistor in accordance with the principles described herein.

FIG. 16 illustrates a flowchart of a method 1600 for overdriving a power field-effect transistor in accordance with the principles described herein. The method 1600 is performed in the context in which the power field-effect transistor comprises a part of an epitaxial stack of semiconductor layers having a heterojunction between at least two adjacent semiconductor layers, and in which there is a sense transistor comprising another part of the epitaxial stack of semiconductor layers, and in which a drain node of the sense field-effect transistor is connected to a drain node of the power field-effect transistor. For instance, the method 1600 may be performed in the context of the circuit 500 of FIG. 5.

The method 1600 includes monitoring a parameter of the power field-effect transistor (act 1601), and detecting whether there is an indication that the sense field-effect transistor has entered saturation (decision block 1602). If there is no such indication ("No" in decision block 1602), the monitoring simply continues (act 1601). On the other hand, if there is an indication that the power field-effect transistor has entered saturation ("Yes" in decision block 1602), then the gate of the power transistor is overdriven (act 1603), and the monitoring continues (act 1601). The cycle represented by acts 1601, 1602, 1603 may be repeated for multiple levels of gate overdrive voltage. If the gate overdrive is successful in timely removing the power transistor from saturation ("Yes" in decision block 1604), then the power transistor continues to operate and monitoring of the indication continues (act 1601). On the other hand, if the gate overdrive is not successful in timely removing the power transistor from saturation ("No" in decision block 1604), the power transistor is shut down (act 1605).

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed:

1. A circuit for overdriving a power field-effect transistor, the circuit comprising:

a power field-effect transistor comprising a part of an epitaxial stack of semiconductor layers having a heterojunction between at least two adjacent semiconductor layers;

a sense field-effect transistor comprising another part of the epitaxial stack of semiconductor layers, a drain node of the sense field-effect transistor connected to a drain node of the power field-effect transistor;

a saturation detection circuit that is configured to detect an indication that the sense field-effect transistor has entered saturation; and a gate overdrive circuit configured to increase a gate voltage applied to a gate node of the power field-effect transistor when the saturation detection circuit detects the indication that the sense field-effect transistor enters saturation.

2. The circuit in accordance with claim 1, the power field-effect transistor being an enhancement mode gallium nitride power transistor, the sense field-effect transistor being an enhancement mode gallium nitride sense transistor.

3. The circuit in accordance with claim 1, the power field-effect transistor being an enhancement mode silicon carbide power transistor, the sense field-effect transistor being an enhancement mode silicon carbide sense transistor.

4. The circuit in accordance with claim 1, the power field-effect transistor being an enhancement mode gallium arsenide power transistor, the sense field-effect transistor being an enhancement mode gallium arsenide sense transistor.

5. The circuit in accordance with claim 1, the power field-effect transistor being an enhancement mode indium gallium arsenide power transistor, the sense field-effect transistor being an enhancement mode indium gallium arsenide sense transistor.

6. The circuit in accordance with claim 1, the power field-effect transistor being an enhancement mode indium aluminum arsenide power transistor, the sense field-effect transistor being an enhancement mode indium aluminum arsenide sense transistor.

7. The circuit in accordance with claim 1, the power field-effect transistor being a high electron mobility transistor (HEMT), one part of a layer of the epitaxial stack of semiconductor layers forming an active layer of the HEMT.

8. The circuit in accordance with claim 7, the sense field-effect transistor also being a high electron mobility transistor (HEMT).

9. The circuit in accordance with claim 1, the sense field-effect transistor being a finger transistor fabricated in a same finger array as the power field-effect transistor.

10. The circuit in accordance with claim 1, the sense field-effect transistor being diode configured with a gate node of the sense field-effect transistor connected to a source node of the sense field-effect transistor.

11. The circuit in accordance with claim 10, the saturation detection circuit comprising a comparator configured to compare a voltage at the source node of the sense field-effect transistor to a reference voltage, and output a signal representing saturation detection based on the comparison.

12. The circuit in accordance with claim 1, a gate node of the sense field-effect transistor connected to the gate node of the power field-effect transistor.

13. The circuit in accordance with claim 12, the saturation detection circuit comprising a comparator configured to compare a voltage at the drain node of the sense field-effect transistor to a reference voltage, and output a signal representing saturation detection based on the comparison.

14. The circuit in accordance with claim 1, further comprising:

a desaturation circuit configured to turn the power field-effect transistor off if 1) the gate overdrive circuit has already increased the gate voltage applied to the gate node in response to a prior detection that the sense field-effect transistor has entered saturation, 2) the saturation detection circuit once again detects an indication that the sense field-effect transistor has entered saturation, and 3) the gate overdrive circuit cannot increase the gate voltage applied to the gate node of the power field-effect transistor further.

15. The circuit in accordance with claim 1, configured such that there are multiple possible levels of overdrive gate voltage that can be applied to the gate node of the power field-effect transistor, the circuit being configured such that the saturation detection circuit that is configured to repeatedly detect an indication that the sense field-effect transistor has entered saturation; and the gate overdrive circuit is configured to increase the gate voltage applied to the gate node of the power field-effect transistor in response to each successive detection of the indication that the sense field-effect transistor has entered saturation.

16. The circuit in accordance with claim 1, the power field-effect transistor configured to operate with a drain voltage of greater than 100 volts.

17. A method for overdriving a power field-effect transistor, wherein the power field-effect transistor comprises a part of an epitaxial stack of semiconductor layers having a heterojunction between at least two adjacent semiconductor layers, the method comprising detecting an indication that a sense field-effect transistor has entered saturation, the sense field-effect transistor comprising another part of the epitaxial stack of semiconductor layers, a drain node of the sense field-effect transistor connected to a drain node of the power field-effect transistor; and increasing a gate voltage applied to a gate node of the power field-effect transistor in response to detecting the indication that the sense field-effect transistor enters saturation.

18. The method in accordance with claim 17, further comprising:

turning the power field-effect transistor off if 1) the gate voltage applied to the gate node has already been increased in response to a prior detection that the sense field-effect transistor has entered saturation, 2) the method includes once again detecting an indication that the sense field-effect transistor has entered saturation, and 3) the gate voltage applied to the gate node of the power field-effect transistor cannot be increased further.

19. The method in accordance with claim 17, wherein there are multiple possible levels of overdrive gate voltage that can be applied to the gate node of the power field-effect transistor, the method further comprising:

repeatedly detecting an indication that the sense field-effect transistor has entered saturation; and increasing the gate voltage applied to the gate node of the power field-effect transistor in response to each successive detection of the indication that the sense field-effect.

* * * * *